United States Patent [19]
Erickson et al.

[11] Patent Number: 5,598,424
[45] Date of Patent: Jan. 28, 1997

[54] ERROR DETECTION STRUCTURE AND METHOD FOR SERIAL OR PARALLEL DATA STREAM USING PARTIAL POLYNOMIAL CHECK

[75] Inventors: Charles R. Erickson, Fremont; Philip M. Freidin, Sunnyvale, both of Calif.; William A. Wilkie, Edinburgh, Scotland

[73] Assignee: Xilinx, Inc., San Jose, Calif.

[21] Appl. No.: 259,765

[22] Filed: Jun. 14, 1994

Related U.S. Application Data

[63] Continuation-in-part of Ser. No. 641,994, Jan. 16, 1991, Pat. No. 5,321,704.

[51] Int. Cl.$^6$ .................................................. G06F 11/00
[52] U.S. Cl. ................................................. 371/48; 371/5.1
[58] Field of Search ........................ 371/2.1, 37.1, 371/47.1, 37.7, 5.2, 5.3, 22.4, 22.1, 53, 48, 15.1, 67.1, 37.5

[56] References Cited

U.S. PATENT DOCUMENTS

| | | | |
|---|---|---|---|
| 4,208,650 | 6/1980 | Horn | 371/471 |
| 4,276,646 | 6/1981 | Haggard et al. | 371/37 |
| 4,507,782 | 3/1985 | Kunimasa et al. | 371/32 |
| 4,594,711 | 6/1986 | Thatte | 371/25 |
| 4,706,216 | 11/1987 | Carter | 365/94 |
| 4,723,244 | 2/1988 | Iaconi | 371/37 |
| 4,870,302 | 9/1989 | Freeman | 307/465 |
| 4,964,124 | 12/1988 | Burnett | 371/15.1 |
| 5,140,595 | 8/1992 | Geldman et al. | 371/39 |

FOREIGN PATENT DOCUMENTS

| | | | |
|---|---|---|---|
| 0233075 | 8/1987 | European Pat. Off. | H03M 13/00 |
| 0230730 | 8/1987 | European Pat. Off. | H03M 13/00 |

OTHER PUBLICATIONS

Xilinx Programmable Gate Array Data Book, 1989, available from Xilinx, Inc., 2100 Logic Drive, San Jose, California 95124.

Swanson, Robert; "Understanding Cyclic Redundancy Codes", pp. 93–99, Computer Design, Nov. 1975.

IEEE Transactions On Communication Technology, vol. 38, No. 1, Jan. 1990, New York, pp. 111–114, XP102585, Castagnoli et al., "Optimum Cyclic Redundancy–Check Codes With 16–Bit Redundancy".

*Primary Examiner*—Robert W. Beausoliel, Jr.
*Assistant Examiner*—Phung M. Chung
*Attorney, Agent, or Firm*—Edel M. Young; Norman R. Klivans

[57] ABSTRACT

The present invention provides a means and method of generating a long error checking polynomial remainder having the ability to detect errors with high reliability and inserting only a subset of the polynomial remainder periodically into a data stream, then at the receiving end recalculating the polynomial remainder and checking the inserted subset for errors. The polynomial has the property that the current remainder value is a function of all data previously transmitted in a transmission session. The subset transmitted also preferably has this property. A longer subset of the polynomial remainder, or the full polynomial remainder, may be inserted less frequently, and is preferably sent and tested at the end of the transmission session. Both serial and parallel data streams may be checked.

2 Claims, 11 Drawing Sheets

FIG. 1
(PRIOR ART)

| INPUT | REGISTER | | | | |
|---|---|---|---|---|---|
| | $A_4$ | $A_3$ | $A_2$ | $A_1$ | $A_0$ |
| 0 | 0 | 0 | 0 | 0 | 0 |
| 1 | 1 | 0 | 1 | 0 | 1 |
| 1 | 0 | 1 | 0 | 1 | 0 |
| 0 | 1 | 0 | 1 | 0 | 0 |
| 1 | 0 | 1 | 0 | 0 | 0 |
| 0 | 1 | 0 | 0 | 0 | 0 |
| 0 | 1 | 0 | 1 | 0 | 1 |
| 0 | 1 | 1 | 1 | 1 | 1 |
| 1 | 1 | 1 | 1 | 1 | 0 |
| 1 | 1 | 1 | 1 | 0 | 0 |
| 0 | 0 | 1 | 1 | 0 | 1 |
| 1 | 0 | 1 | 1 | 1 | 1 |
| 1 | 0 | 1 | 0 | 1 | 1 |

ERROR DETECTION STRUCTURE AND METHOD FOR SERIAL OR PARALLEL DATA STREAM USING PARTIAL POLYNOMIAL CHECK

CONTINUATION INFORMATION

This is a continuation-in-part of U.S. patent application Ser. No. 07/641,994 filed Jan. 16, 1991, now U.S. Pat. No. 5,321,704 issued Jun. 14, 1994.

FIELD OF THE INVENTION

This invention relates to error detection, more particularly to detection of errors in a stream of data before the entire data stream has been transmitted.

BACKGROUND

Many error detection and correction codes are known, including single and multiple parity bit codes, Hamming codes, and cyclic redundancy codes. As a general rule, the longer the string of bits used to store error checking information, the higher the probability that errors can be detected (and corrected if error correction is also employed). Further, the longer the string of data bits on which error detection is employed, the smaller the percentage increase in transmission time caused by appending a string of error checking information to the end of a data stream. Transmitting a long stream of error checking bits with a relatively short stream of data adds significantly to the total length of the transmission. However, transmitting a stream of error checking bits after a long stream of data causes a significant time delay before an error in the transmission can be detected. The longer the string of data bits to which error checking bits are appended, the longer the wait before discovering an error has occurred. In some applications it is important to minimize not only the percentage increase in the data stream used for error checking but also to minimize the waiting time for detecting any errors. Yet it may be necessary to assure with high reliability that no undetected errors have occurred.

One situation in which it is important to transmit data accurately and to detect quickly that an error has occurred is in the loading of memory cells which configure a logic cell array. Such logic cell arrays are explained more fully in U.S. Pat. Nos. 4,870,302 and 4,706,216, which are incorporated herein by reference. Such logic cell arrays are also described in xilinx Data Book ©1989, available from Xilinx, Inc., 2100 Logic Drive, San Jose, Calif. 95124. The memory cells each control an interconnection, form part of a data table, select a logic function or part of a logic function, or otherwise control the configuration of the configurable logic array. This step of loading memory cells configures the logic array so that it takes on the function selected by a user. If any of the memory cells are not loaded with the proper logical value, the resultant configured logic array may not perform as intended. Therefore it is important that all data be loaded accurately.

To provide both high reliability and earlier error detection, prior art users have provided a nested hierarchy of error detection (and sometimes correction). For example a 9-bit byte protocol in which each byte includes 1 parity bit can be nested in a long chain using cyclic redundancy checking. Many other nested error checking methods have been used and can be imagined.

Cyclic Redundancy Codes

Because the preferred embodiment of the present invention is implemented using cyclic redundancy codes, we will now describe the operation of a typical cyclic redundancy code generator or checker. The typical implementation of a cyclic redundancy code uses a combination of storage devices and exclusive-OR (XOR) gates and has the property that for one transmission session (beginning when transmit and receive ends are initialized) the set of bits in a cyclic redundancy check code is a function of all data transmitted in the session.

Figure 1:
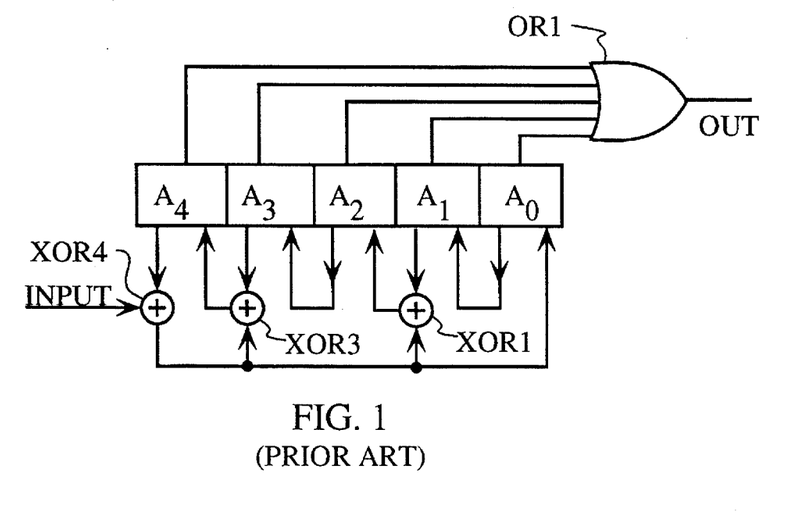
FIG. 1 shows a representation of a prior art 5-bit cyclic redundancy code shift register.

FIG. 1 represents a shift register circuit for implementing a basic cyclic redundancy check function $x^5+x^4+x^2+1$. Blocks A4 through A0 represent storage devices such as D flip flops. Data on line INPUT are applied to XOR gate XOR4 with the output of register $A_4$ and the output of XOR4 is applied to the input of flip flop $A_0$. On the same clock cycle the value applied to flip flop $A_0$ is also applied to XOR gates XOR3 with the output of flip flop $A_3$, and the output of XOR gate XOR3 is applied to the input of flip flop $A_4$. Likewise, this signal is applied to XOR gate XOR1 with the output of flip flop $A_1$ and the output of XOR gate XOR1 applied to the input of flip flop $A_2$. As can be seen in FIG. 1, the outputs of flip flops $A_0$ and $A_2$ are applied to the input terminals of flip flops $A_1$ and $A_3$ respectively.

At the next clock cycle, data on the input terminals of the flip flops are shifted to output terminals of the flip flops. Thus, on the next clock cycle, the value which had been applied to the input terminal of flip flop $A_4$ is shifted to the output terminal of flip flop $A_4$ and combined with the next data value on line INPUT and again applied to the input terminals of flip flop $A_0$ and XOR gates XOR3 and XOR1. XOR gates XOR3 and XOR1 combine this signal with output signals from flip flops $A_3$ and $A_1$ respectively to generate signals applied to input terminals of flip flops $A_4$ and $A_2$ respectively while data are simultaneously being applied by the outputs of flip flops $A_2$ and $A_0$ to the inputs of flip flops $A_3$ and $A_1$ respectively.

The function in the shift register thus cycles through the individual flip flops, with new data affecting the set of values on each clock cycle. Thus it can be seen that the values in the flip flops are a function of the data just applied to the shift register as well as a function of all previous data applied to the shift register. It can also be seen that a function of the last data bit (and previous bits) is available at flip flop outputs one clock cycle after the last data bit is applied to the register. A logic gate such as OR gate OR1 can be used to monitor the register, generating a logical zero only if all flip flops output logical zero. Other logic gates can be used, and can be selected to detect any desired remainder.

Figure 2:
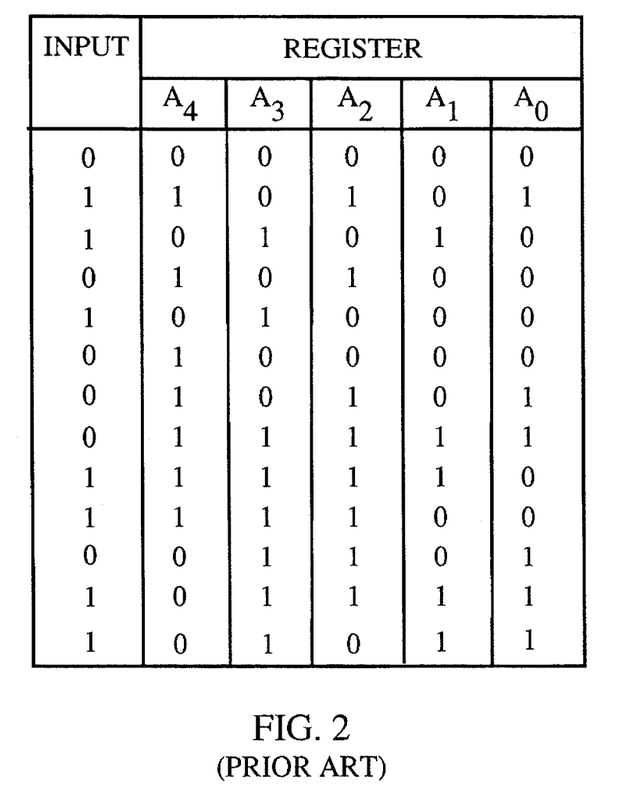
FIG. 2 shows a table of values in the flip flops of the register of FIG. 1 at successive clock cycles in response to the input data shown.

FIG. 2 shows a table of flip flop values for the particular input bit pattern indicated in the left column, subsequent rows in FIG. 2 occurring on subsequent clock cycles.

At the end of an input data stream which contains errors, a five-bit register has one chance out of $2^5$, or one chance out of 32, of failing to detect the error.

Figure 3:
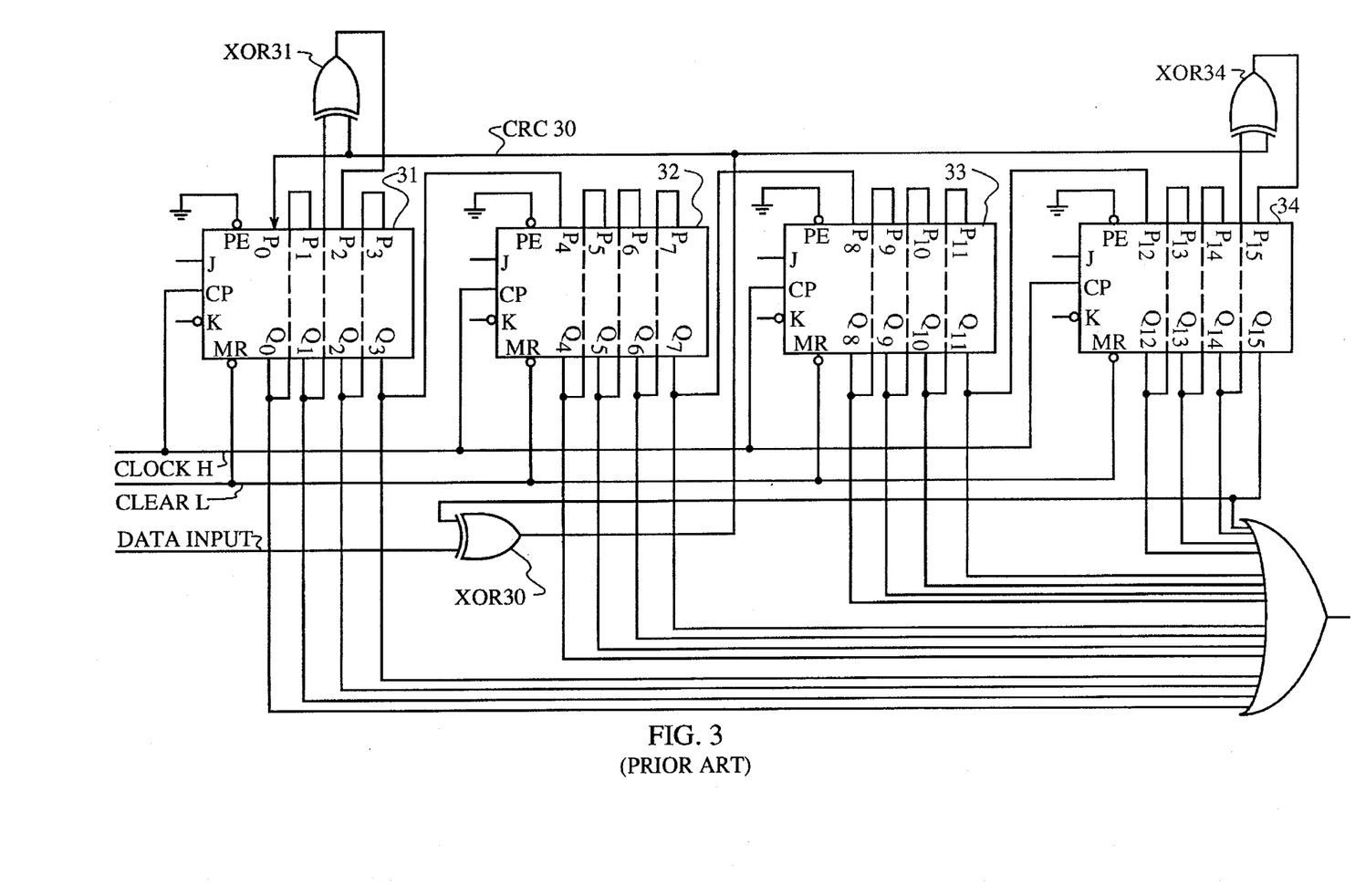
FIG. 3 shows a circuit for implementing a prior art CRC-16 code.

In order to improve the reliability of error detection, longer registers are used, a 16-bit cyclic redundancy code register being common. FIG. 3 shows a widely used CRC-16 implementation, using $x^{16}+x^{15}+x^2+1$ as the generator polynomial.

The circuit of FIG. 3 implements this CRC-16 cyclic redundancy code. XOR gate XOR30 combines the DATA input signal with the output signal $O_{15}$ of shift register chip 34 to generate signal CRC30. Signal CRC30 is applied to shift register input $P_0$ and to the inputs of XOR gates XOR31 and XOR34. XOR gate XOR31 applies the XOR function of CRC30 and the output $Q_1$ of chip 31 to input $P_2$ of chip 31. Similarly, XOR gate XOR34 applies the XOR function of CRC30 and output $Q_{14}$ of chip 34 to input $P_{15}$ of chip 34. Other data bits in the shift register are simply shifted to the next flip flop in the shift register. As with the smaller cyclic check generator described above in connection with FIGS. 1 and 2, the result generated by the CRC register from the data stream becomes available on the outputs of the 16 flip flops of the shift register within one clock cycle after the last bit of data is received. At the transmit end, if the 16-bit result generated by the function generator is appended to the end of the original data stream to form a transmission block, and the transmission block is processed at the receive end using the same function generator, the final function in the function generator at the receive end will be zero if no errors have occurred.

A CRC-16 generator will detect errors with high reliability, detecting all single and double errors, all burst errors of an odd number of bits, all burst errors of length less than 16, and will miss larger errors only one time in about 65,000 ($2^{16}$). In order to check a data stream in the conventional manner using the CRC generator of FIG. 3, it is necessary to append the full 16 bit result to the end of the data stream. If the data stream is short, the percentage increase added by the 16 bits of CRC data is significant, and if the data stream is long, the wait before detecting the error is significant.

SUMMARY OF THE INVENTION

The present invention provides a means and method for detecting errors quickly, for detecting errors with high reliability, and for adding a reduced number of error check bits to the data stream.

According to the present invention, an error checkword is generated, which is a function of all data bits in the transmission session. The error checkword is of sufficient length to have high probability of detecting an error. In one embodiment, a serial data stream to be checked is divided into frames, and a subset of the error checkword is appended to the end of each frame to form a transmission block. Rather than clearing the checkword to zero after appending the error checkword subset, the full checkword is retained and used for generating the next subset to be appended to the next frame. The probability of detecting an error is higher than for an equal number of bits appended when the register is cleared, because an error previously undetected will usually affect the next and subsequent transmitted subsets of the checkword. A larger subset of bits of the full checkword may be appended to the end of the entire data stream in order to increase the reliability of the error detection.

In another embodiment, each bit in a parallel data stream is applied to an input terminal of an XOR gate. An error checkword is generated by a shift register as the parallel data stream is applied to the input terminals. The other input terminal of each XOR gate receives a previous bit of the error checkword shift register. All parallel bits of the data stream contribute to the error checkword. The parallel data stream provides one set of bits (one word) each clock cycle and the error checkword shift register shifts once each clock cycle. As in the serial embodiment, an error checkword is generated at the transmit and receive ends. A subset of the error checkword or some function of the checkword is sent from the transmit end to the receive end. At the receive end, the error checkword is tested for an expected result.

In both embodiments, high reliability is achieved with minimum increase in length of the data stream, and errors are detected more promptly than if error checking information were only sent at the end of the data stream. If the transmission session is very long, a larger subset of the checkword may also be inserted with less frequency into a very long data stream.

DETAILED DESCRIPTION OF SOME PREFERRED EMBODIMENTS

A transmission block is generated at the transmit location by dividing the data stream of one transmission session into data frames, generating and updating a checkword which is a function of previous bits in the entire data stream, and appending a subset of the checkword to the end of each data frame. One data frame plus one checkword subset forms one transmission block. The full checkword may advantageously be appended to the end of the data stream of the transmission session in order to achieve high confidence that any data transmission errors have been detected.

Figure 4:
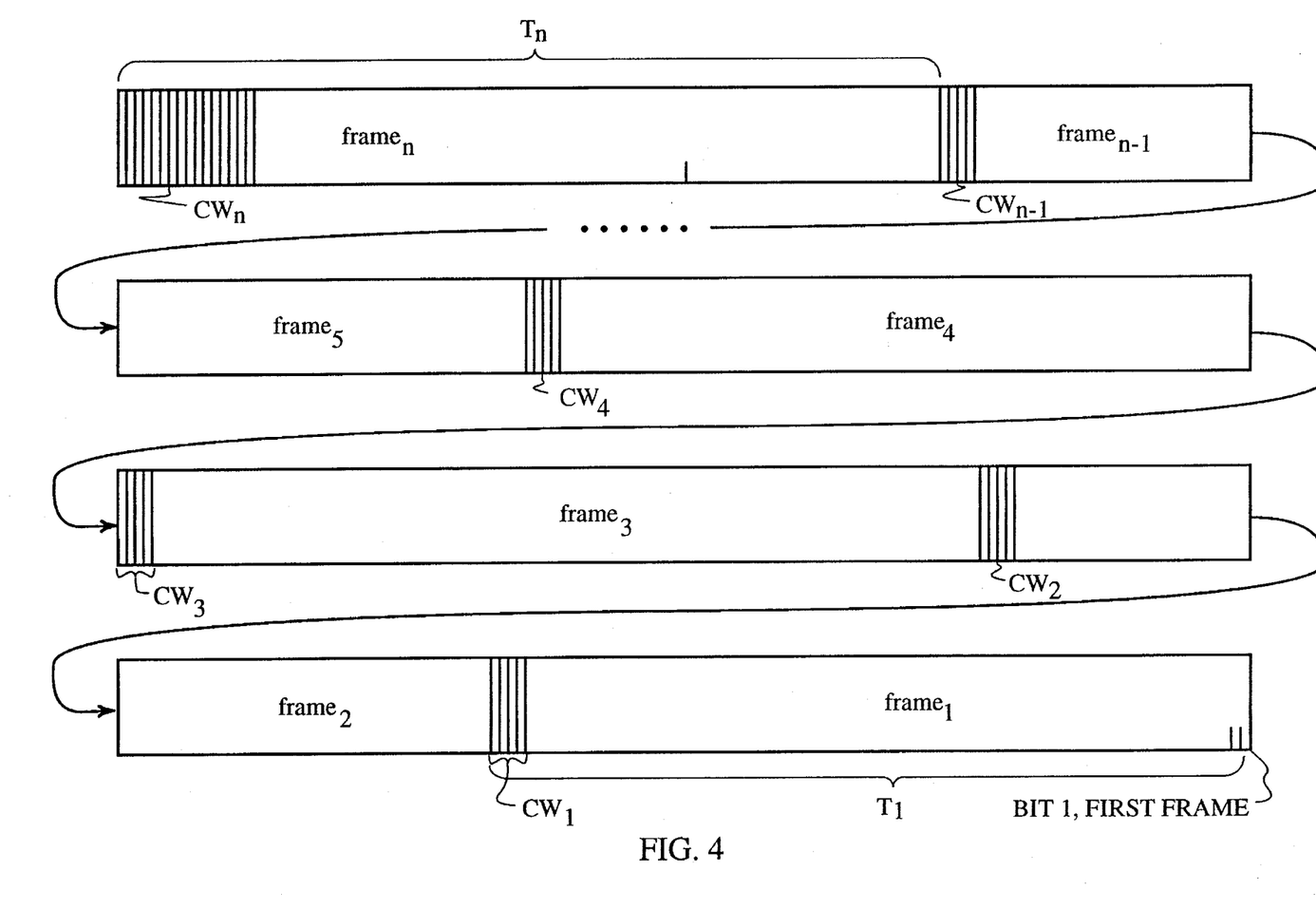
FIG. 4 shows a representation of a bit stream having error detecting information inserted periodically, according to the present invention.

FIG. 4 shows a data stream which has been broken into data frames and error detection bits inserted. The data stream has been divided into N frames, with a checkword subset $CW_1$ through $CW_n$ inserted after every frame. As illustrated, checkword subset $CW_n$ appended after the last frame is longer than other subsets. Many different patterns of inserting subsets of the checkword periodically into a data stream may be selected, as long as the same pattern is used at both ends of the transmission.

Figure 5A:
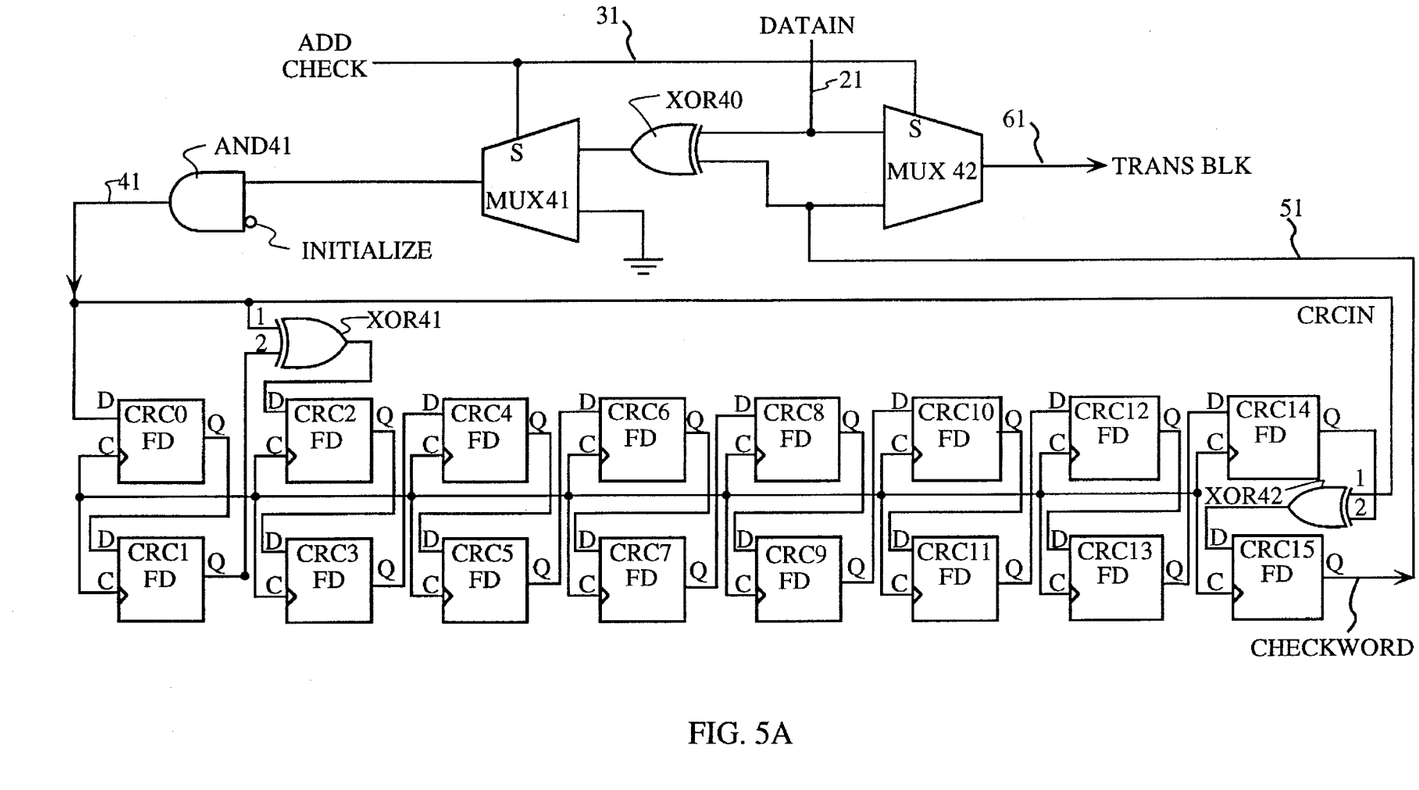
FIGS. 5a, 5b and 5b show circuits for generating a CRC-16 cyclic redundancy code at transmit and receive ends respectively, and at the receive end detecting errors indicated by partial or full strings of error checking information, and also for selecting between two error checking means.

FIG. 5a; Transmit End; Error Detection Code Inserted

In the presently described embodiment, the error detection bits of the checkword are calculated using the CRC-16 formula discussed above in connection with FIG. 3. Other formulas insert XOR functions at different positions and different numbers of positions in the 16-bit chain. Still other formulas use a polynomial of another length, for example a CRC-32 polynomial, or calculate a parity check or checksum. Any formula in which the checkword is a function of all previous data in the transmission session can be used.

For every bit of the checkword subset appended to the frame to form the transmission block, one logical zero is entered into the CRC generator at the transmit end. For example, in FIG. 5a, data on DATAIN line 21 are simultaneously applied to MUX42 and through XOR gate XOR40 in combination with CHECKWORD output on line 51 to multiplexer MUX41. ADDCHECK line 31 causes MUX41 and MUX42 to pass data from line 21 to lines 41 and 61 respectively until the end of a data frame is reached. At this point ADDCHECK line 31 switches state causing multiplexer MUX42 to apply the data present on line 51 during four successive clock cycles to line 61 to complete a transmission block. While these four checkword subset bits are being appended to the data frame, four logical zero's are entered into the 16-bit CRC generator on line 41, in response to the ADDCHECK line 31 causing MUX41 to apply a ground signal through AND gate AND41 to line 41. Thus at the end of generating a transmission block there are four logical zeros in flip flops CRC0 through CRC3 of the 16-bit checkword generator at the transmit end.

In a similar fashion for a checksum method, a subset of bits can be captured and appended to the transmit data frame. At the receive end these data can be compared to the corresponding checksum calculated at the receive end. Alternatively, a subset of the checksum calculated at the transmit end and sent to the receive end can be subtracted from the version of the checksum calculated at the receive end. Subtracting gives a zero result for the checksum subset if no errors have been found. If the subtraction is done in the register at the receive end the same subtraction is performed in the register at the transmit end.

In one embodiment, the error detection bits are calculated at the transmit end using a software package which emulates the hardware of FIG. 5a.

The transmission session of transmission blocks including the checkword subsets can be stored in an electronic storage medium before being transmitted to the receive end.

Figure 5B:
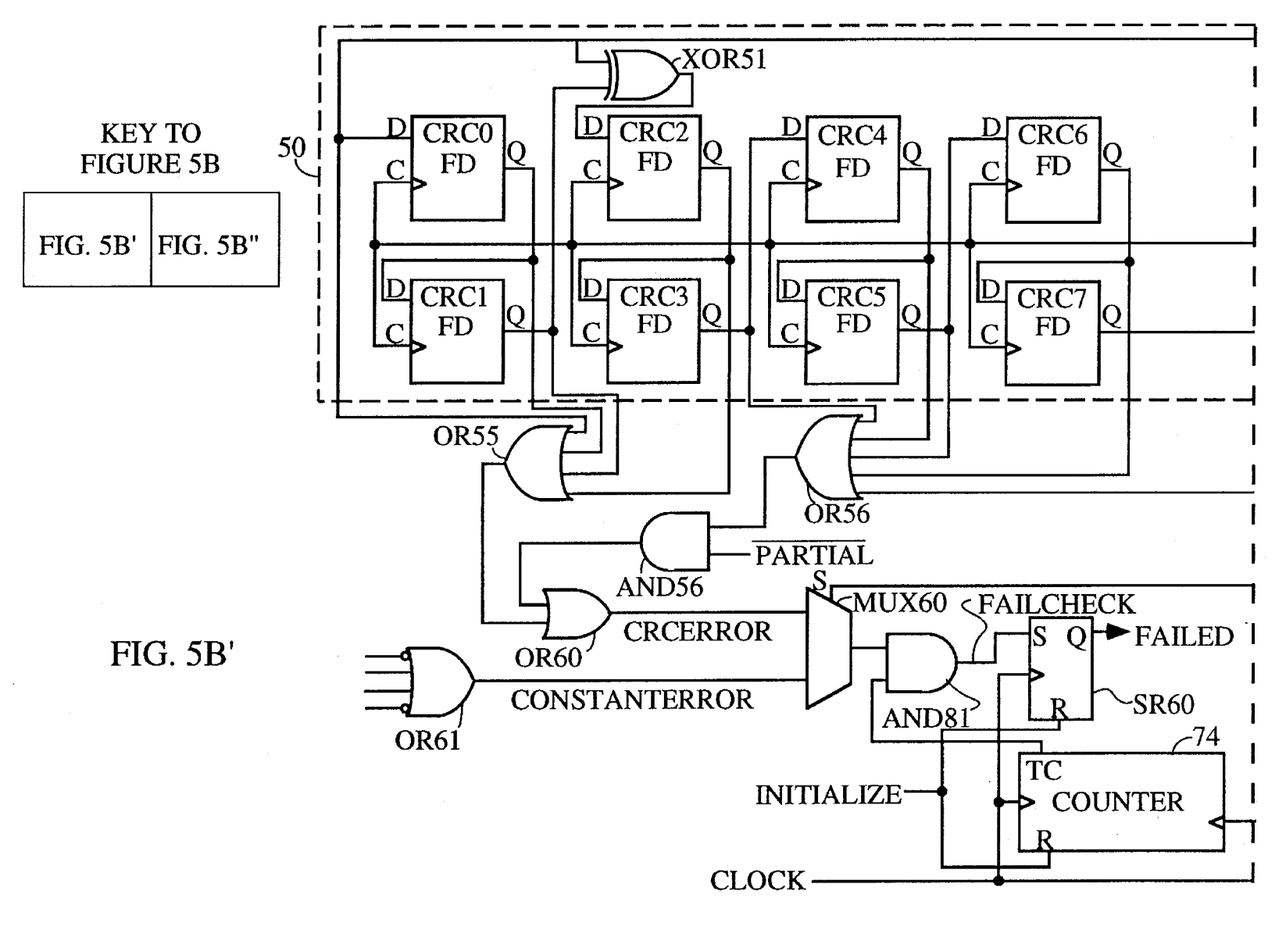

FIG. 5b; Receive End Error Detection with Partial or Full CRC-16 Check and Alternative Constant Check At the receive end, as the data stream is being received, it is necessary to calculate the error detection bits using the same formula as at the transmit end, so that the result of the transmit end calculation may be compared to the result of the receive end calculation.

FIG. 5b shows one receiving circuit which implements the error detection means of the present invention. This circuit is able to receive the bit stream of FIG. 4 as generated by the circuit of FIG. 5a and detect errors using both the checkword subset and the full checkword. This particular circuit is also able as an alternative, to detect a constant bit pattern inserted at the end of a data frame or a bit stream, a choice which may be desired when the automatic means of generating a CRC code are not available to a user at the transmit end, but when there is still need to detect gross transmission errors.

As shown in FIG. 5b, a logical zero initializing signal, labeled INITIALIZE, is applied to the R reset terminal of counter 74, and thereby resets counter 74 to an initial value from which it counts down once per CLOCK cycle. Alternatively, an initial count value may be loaded into counter 74 by means not shown but well known. The INITIALIZE signal is also applied to AND gate AND50 for 16 clock cycles, thereby causing logical zero's to be loaded into all flip flops CRC0 through CRC15 of CRC generator 50. Then the transmitted data stream in which error detection bits have been inserted is applied to line DATAIN. Configuration control circuit 72 captures the first three bits of the data frame. The three bits comprise one start bit, always logical one (in this embodiment), followed by two configuration bits, the first of which selects mode (CRC or specified constant) and the second of which selects clock speed. MUX51 is initially set by the initial zero output of flip flop FD61 to receive input from line CFDATAB. The logical 1 start bit is applied via MUX51 to flip flop FD63 and transferred on the next clock cycle via MUX52 to flip flop FD62 at which time the mode bit is in flip flop FD63. On the next clock cycle the start bit is transferred by OR gate OR53 to flip flop FD61. The mode bit is transferred to flip flop FD62, and the speed bit to flip flop FD63. On all following clock cycles, the logical one start bit in flip flop FD61 is applied to OR gate OR53 and therefore the logical one is held in flip flop FD61. This logical one start bit value is also applied to multiplexers MUX51 and MUX52. This causes the mode bit to be held in flip flop FD62 and the speed bit to be held in flip flop FD61.

Since the Q output of flip flop FD62 controls MUX60, the mode bit causes MUX60 to select between looking at the CRCERROR line and looking at the CONSTANTERROR line. The CRCERROR line indicates whether an error is indicated in CRC generator 50, and the CONSTANTERROR line indicates whether an error has been detected by an improper sequence of bits to OR gate OR61. The function selected by MUX60 is applied to AND gate AND81. At a time indicated by counter 74 on the TC output of counter 74 the output value of AND gate AND81 on line FAILCHECK is applied by set flip flop SR60 to the FAILED output line to indicate whether the transmission block has passed or failed the error check.

The output from clock speed flip flop FD63 selects clock speed on a circuit not shown. The logical one applied by flip flop FD61 to MUX51, MUX52 and OR53 captures the three bits in control register 72 until the circuit is reset.

Data on line CFDATAB are also applied to an input of XOR gate XOR50. This DATA input is combined by XOR gate XOR50 with the output of D flip flop CRC15 from 16-bit shift register 50. When the circuit is not being initialized or configured, the INITIALIZE and CONFIGURE lines provide a constant logical one, so the output of XOR gate XOR50 is applied to CRCIN to produce the cyclic feedback of CRC generator 50. In this case the output of XOR gate XOR50 is provided on line CRCIN to D flip flop CRC0. The value on line CRCIN is also provided to XOR gates XOR51 and XOR52, which combine this CRCIN value with outputs of D flip flops CRC1 and CRC14 to generate inputs to D flip flops CRC2 and CRC15 respectively in a manner equivalent to that of the prior art CRC-16 circuit of FIG. 3. Data are shifted from input to output of each D flip flop on every high-going signal on the CLOCK line. On subsequent CLOCK cycles, values are shifted through the shift register as shown, with new data being inserted at D flip flops CRC0, CRC2, CRC15 each clock cycle. Thus as in prior art cyclic redundancy shift registers, the 16-bit shift register carries a bit pattern which is a function of all data entered. In particular, values held in flip flops CRC0, CRC2, and CRC15 are immediately responsive to previous data while values in other flip flops are responsive to all but the last few bits.

If no errors have occurred, the CRC checkword subset which was appended at the transmit end to the end of a data frame will cause logical zero's to appear in as many flip flops of the receive end CRC generator as there are bits in the checkword subset. In the embodiment shown in FIGS. 5a and 5b, after the four-bit checkword subset has been received, there will be four logical zero's in flip flops CRC0 through CRC3 if no errors have occurred. Note that this matches the four zeros in flip flops CRC0 through CRC3 at the transmit end. However, the embodiment of FIG. 5b checks for error one cycle earlier by checking the four bits in CRC0 through CRC2 and on line CRCIN, which will shift to flip flops CRC0 through CRC3 after the next clock cycle.

Initializing

Before a transmission session begins, the CRC generators at the transmit and receive ends must be initialized to hold identical values, typically all zero's. As shown in FIG. 5b, holding INITIALIZE at zero for 16 clock cycles will cause shift register 50 to carry all zero's. If a software implementation of the invention is being used at either or both ends, the equivalent action must be performed in software. Preferably some means such as shown in FIG. 5b is used at both transmit and receive ends to assure that CRC-16 registers 50a and 50b begin operation holding all zeros. Alternatively, registers 50a and 50b may be cleared in one cycle by a reset signal to all D flip flops, on a reset line not shown but well known. However, providing a special reset for the CRC shift register of FIG. 5b may not be practical in an application which can not spare a reset pin for connecting to this circuit. The preferred initializing operation is further discussed below in connection with FIG. 7.

Selecting Between Checking Few Bits and Checking Many Bits

As a further novel feature of the present invention, more than one subset of the checkword may be appended to frames of the data stream for error checking. In the embodiment of FIG. 5b, both a 4-bit subset and a 16-bit complete set of the D flip flops may be checked for errors. As shown in FIG. 4, the smaller subset is inserted as $CW_1$ through $CW_{n-1}$ after every data frame and checked during receiving of the data stream. Then the larger checkword $CW_n$ is sent and checked at the end of the data stream. The selection between partial and full checking is performed by AND gate AND56 as controlled by the input line PARTIAL. A low value on line PARTIAL causes only the three bits in D flip flops CRC0 through CRC2 plus the value on CRCIN generated from CRC15 and DATA to be checked. A high value on line PARTIAL causes up to 16 bits to be checked.

Less Than All Bits Checked in Final Check

FIG. 5b also shows dotted lines indicating optional connection of certain flip flops to OR gate OR57. If the dotted line connections are not made, an 11-bit subset may be checked. (Of course other subsets can be checked, as readily understood from imagining other dotted lines in FIG. 5b.) Dotted lines at the output of OR gate OR58 and the output of CRC10 indicate that in one embodiment these bits are not checked during the final check at the end of the bit stream. The number of bits checked at the end of the bit stream affects the confidence level of the received data accuracy. OR gates can be formed and connected for checking other bits and other numbers of bits depending on the reliability required. In the present case in which the data stream has been periodically checked during transmission, the confidence level may be sufficiently high as a result of repeated partial checks that a full 16-bit set does not need to be appended to the end of the stream.

When a high signal is applied to line PARTIAL, AND gate AND56 passes to OR gate OR60 the OR function generated by OR gate OR56. This input is combined by OR gate OR60 with the signal from OR gate OR55 to generate on line CRCERROR a signal which is a function of all D flip flop values. In the case when the PARTIAL line is high, only if all checked D flip flops hold logical zero will line CRCERROR carry a logical zero, indicating no error. If MUX60 has been set during configuration to respond to CRCERROR, MUX60 will place the CRCERROR signal on line FAILCHECK via AND gate AND81. Line FAILCHECK is connected to set flip flop SR60. The value on line FAILCHECK is placed on line FAILED when counter 74 reaches zero and allows a high signal on the set input of set-reset flip flop SR60. A logical zero on line FAILED indicates no error. If MUX60 has been set to place the CONSTANTERROR signal on line FAILCHECK, the signal on line FAILED will indicate whether a selected bit pattern, for example, the bit pattern 1001 was present or not at the end of a data frame (detected by OR gate OR61).

Partial Check

Assuming the CRC generator 50 is being used, when a low signal is applied to line PARTIAL, AND gate AND56 passes to OR gate OR60 a logical zero regardless of the contents of D flip flops CRC3 through CRC14. This logic zero allows OR gate OR60 to generate on line CRCERROR a signal which is a function only of the values applied to OR gate OR55, which are the values on line CRCIN and in flip flops CRC0 through CRC2. Thus, in the case when the PARTIAL line is low, if CRCIN and D flip flops CRC0 through CRC2 hold logical zero, line CRCERROR will carry a logical zero indicating no errors.

In the particular embodiment shown in FIG. 5b, the partial check of a four bit checkword subset will miss approximately 1 of 16 errors. The full checkword of 16 bits will miss only 1 of $2^{16}$ or 1 of about 65,000 errors, resulting in highly reliable transfer of data without the delay of transmitting the full data stream before detecting an error. Further, because of the novel means and method for repeatedly transmitting error information about all previous data in the four bits of the checkword subset, the likelihood of missing an error until receipt of the final full check is much lower than 1 in 16, with only a 4-bit increase in length of the data frame except at the end.

Alternatives

Clearly the devices of FIGS. 5a and 5b represent only one example of the present invention. Cyclic redundancy detectors having other than 16 bits can be used. Other numbers than 4 of the bits can be sent and checked midstream. A different cyclic error checking circuit can be used. Another error checking circuit may be used as long as the function generated is a function of every bit transmitted so far. Of course the same function must be generated on both the transmit and receive ends of the data stream.

Figure 6:
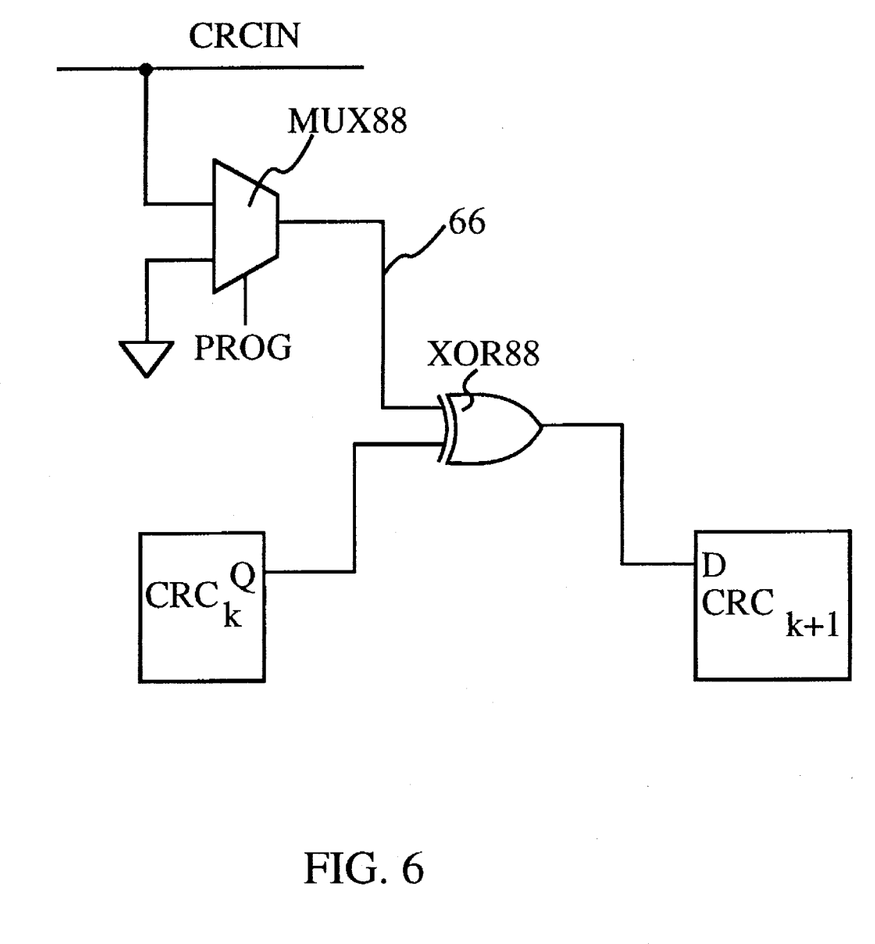
FIG. 6 shows a circuit which allows the coefficients of a CRC generator to be selected by the user.

In some applications it may be desired to allow the user to select between several formulas. The embodiment described below provides this option in hardware. An embodiment can be provided in which the checkword formula is programmable. FIG. 6 shows a circuit which can be inserted between line CRCIN and an XOR gate such as XOR88, equivalent for example to XOR41 of FIG. 5a and XOR51 of FIG. 5b. By setting MUX88 to apply the ground input to line 66, the logic zero input to XOR88 causes the Q output of $CRC_k$ to be transferred to the D input of $CRC_{k+1}$. By setting MUX88 to pass the value on CRCIN to XOR88, the value on CRCIN can be made to affect the value transferred from $CRC_k$ to $CRC_{k+1}$. Any number of CRC flip flops in a CRC generator can be provided with such programmable inputs. Initial data loaded into the receive end circuitry either from the transmit end or by another initializing means can program which CRC polynomial function is to be used.

Figure 7:
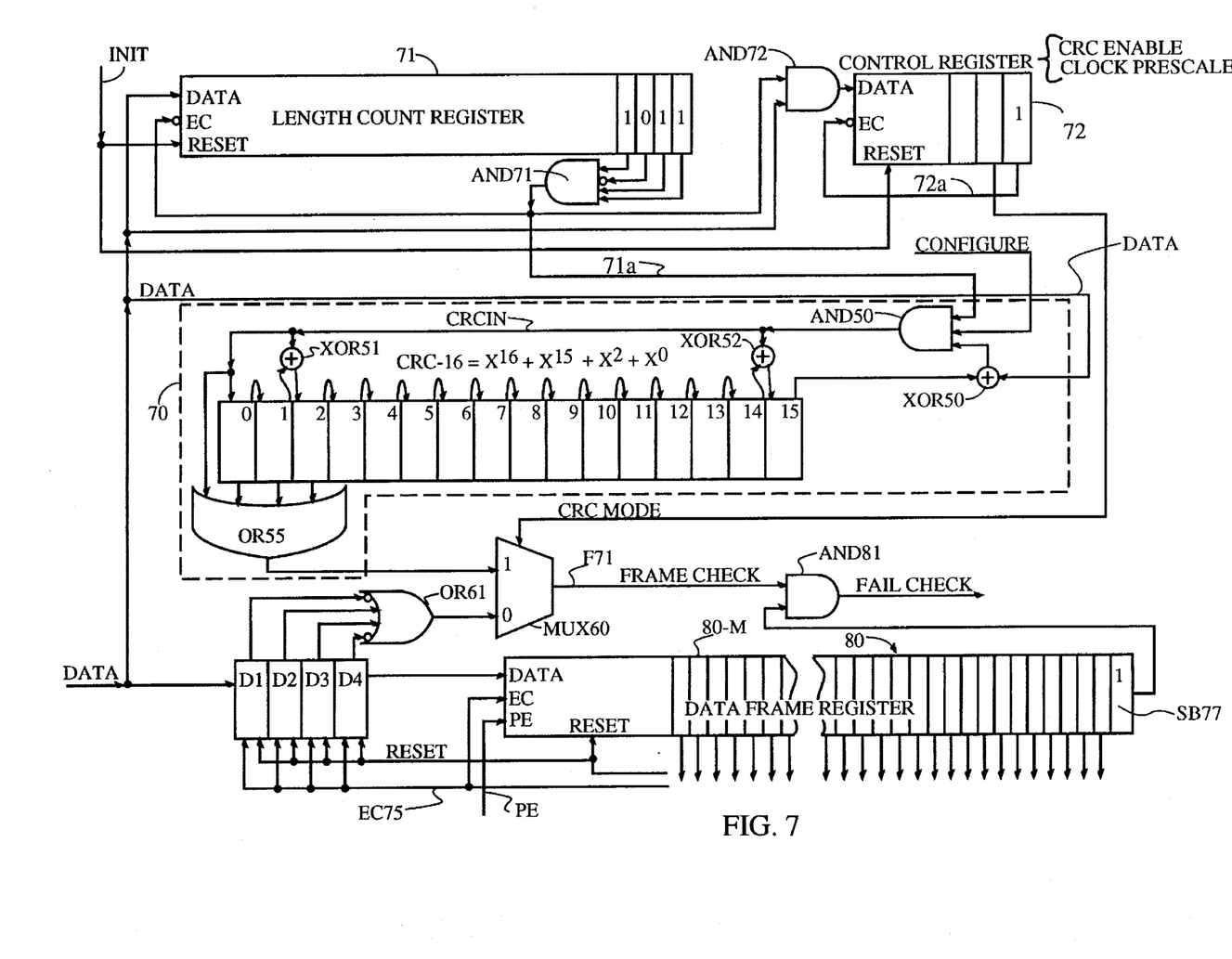
FIG. 7 shows a block diagram of a circuit according to one embodiment of the present invention for implementing a plurality of error checking functions including partial and full checks of a CRC-16 code when loading a configurable logic array chip with a serial data stream.

FIG. 7. Loading a Logic Cell Array

In one embodiment, the data stream is used for configuring a logic cell array. In this case, the data stream is a series of on the order of 200,000 configuration bits. With a bit stream of such a length the time for loading the bit stream into the logic cell array can be such that the time required to reload the entire bit stream, especially multiple times, may be so inconvenient as to be unacceptable.

Data Stream for Configuring a Logic Array Chip

Configuration data bits which form the data stream to be loaded into the logic cell array are calculated at the transmit end by a software package which converts a circuit layout schematic into a stream of bits, each of which is to be loaded into a particular location in the logic cell array. For further discussion of such a logic cell array and how it is configured, see Xilinx Data Book ©1989, available from Xilinx, Inc., 2100 Logic Drive, San Jose, Calif. 95124. A checkword is also calculated at the transmit end. Software emulates the circuit of FIG. 5a, and a checkword subset is inserted into the bit stream to generate transmission blocks, also using software. However, calculation of the checkword and generation of the transmission block may be performed using hardware or software. When configuring a logic cell array chip, the calculation is performed at the receive end using hardware formed as part of the logic cell array chip.

Initializing and Initial Information

FIG. 7 shows a block diagram of a circuit of the present invention used in a logic cell array located at the receive end of a data stream. Before receiving data for configuring the array, an INIT signal resets length count register 71 and control register 72 to have all zero's. The zero output of length count register decoding AND gate AND71 applies a logical low signal to an input of AND gate AND50, which applies logic zero to CRC register 70 regardless of data on the other input of AND gate AND50, and after 16 clock cycles produces all zeros in CRC register 70.

AND gate AND71 feeds control logic (not shown) which causes line EC75 to disable the shifting of information from line DATA into data frame register 80 while initial information is loaded from line DATA into length count register 71. When the initial logical 1011 reaches the end of length count register 71, this logical 1011 applied to AND gate AND71 causes AND gate AND71 to enable AND gate AND72 as well as line EC75. At this point data are loaded into control register 72 and cells D1–D4 of data frame register 80. A logical 1 at the output of control register 72 causes the clock enable EC of register 72 to be disabled so that data in control register 72 remains in the register.

In one embodiment the data in control register 72 includes a bit, CRC MODE, indicating whether CRC register 70 will be checked for errors or whether flip flops D1–D4 will be checked for a constant value at the end of each frame. This bit allows a user to override the error checking by CRC register 70 in the event it is not possible or convenient to generate an appropriate CRC sum at the transmit end. In this embodiment, control register 72 also stores a data bit which controls clock speed. Control register 72 may be implemented as control register 72 of FIG. 5b. In other embodiments control register 72 can store other bits having other functions.

In another programmable CRC embodiment, data enabling a plurality of XOR gates such as XOR51 and XOR52 will be stored in control register 72 as additional attributes and used to select from a variety of CRC polynomials. Circuitry for programming a CRC polynomial is shown in FIG. 6. Control register 72 may store a sequence of bits each of which programs a multiplexer such as MUX88 of FIG. 6, thereby selecting the CRC polynomial to be implemented by a CRC register such as register 70. In yet another embodiment, attributes to cause the error detecting circuit to select between CRC and parity codes are provided. Multiplexers such as MUX60 select from among several input signals generated by several error detecting methods.

With a logical 1 on line DATA and with clock enable line EC75 in a state to enable the clock input to data frame register 80 and to check flip flops D1, D2, D3, and D4, data are shifted through flip flops D1, D2 etc and on through data frame register 80 moving one step with each clock cycle. For simplicity, clock lines, which are well known, are not shown in FIG. 7.

Beginning the CRC Error Check

A sequence of 16 zeros output by AND gate AND50 before length count register 71 has placed a logical 1 on line 71a causes all flip flops of register 70 to hold logical 0. The logical 1 on line 71a is applied to AND gate AND50 which in combination with a high CONFIGURE signal enables AND gate AND50 to receive data from XOR gate XOR50. This data is then applied to line CRCIN.

CRC-16 register 70 computes a new CRC value every clock cycle. If MUX60 has been set by the CRC MODE value in control register 72 to detect the CRC signal from OR gate OR55, at the end of a frame of data when the value on the FRAME CHECK line is read onto the FAIL CHECK line, the FAIL CHECK line will carry a logical 0 only if zero's are at outputs of CRC flip flops CRC0–CRC2 and the input of CRC0, indicating no data transmission error has occurred.

Frame Count

At both transmit and receive ends, there must be a mechanism for counting bits in a data frame. At the transmit end this counting mechanism indicates when check bits are to be appended to a data frame. At the receive end, this counting mechanism indicates when the transmission block is to be checked for errors. Also a mechanism must be provided at each end to indicate when the transmission session is ended. These mechanisms may be a counter or a shift register, for example. Such devices are well known and not described in detail here.

At the receive end, in the case of configuring a logic array chip, the data frame count may be performed by shifting the received data through a shift register having a number of flip flops equal to the number of bits in a transmission block. After clearing the shift register 80 and, if applicable, loading initial information into control and length count registers, a start bit equal to logic one is always shifted into the shift register first. When this start bit reaches flip flop SB77 at a far end of the shift register, it indicates the transmission block has been received. The logical one in the start bit flip flop SB77 can be used to cause data in data frame register 80 to be copied into a row of memory cells in the logic cell array. However, before the data in data frame register 80 are copied, the contents of CRC-16 checkword generator 70 are tested by reading line FAIL CHECK. A logical zero indicates that OR gate OR55 detected logical zero in the checkword subset and that no error occurred or that OR gate OR61 detected the proper constant.

Response to Passing Error Test

The FAIL CHECK line is sampled after the number of bits in a transmission block has been sent. It is possible to provide a constant size frame and to provide hardware (data frame register 80) which counts a corresponding number of bits before sampling the FAIL CHECK line. Alternatively, it is possible to provide a frame length to a counter (see counter 74 of FIG. 5b), which is enabled at the beginning of a transmission session, receives a frame length value, and after receiving the frame length, enables the CRC-16 register, sets a transmission block size in the counter, which counts down for sampling the FAIL CHECK line. Another counter may also store the number of frames to be provided in the transmission session. AND gate AND81 requires a zero on FRAMECHECK line when it receives a logic one in flip flop SB77, which can be used to initiate data transfer from data frame register 80 into an appropriate row of memory cells in the logic cell array if no error has occurred.

If the partial error check indicates no errors, the action depends upon the application for which this error checking method is used. For data communication, the data may be indicated as acceptable and passed to the intended recipient. In the case of configuring a logic cell array, the data which have just been serially loaded into data frame register 80 may be output in parallel from data frame register 80 into a row of memory cells in a logic cell array.

Undetected Error

It is possible for an error not to be detected by a checkword subset transmitted at the end of a data frame. Statistically, one time out of 16, flip flops CRC0–CRC3 (or line CRCIN and flip flops CRC0–CRC2) will carry all zeros in spite of an error, and will fail to detect the error. Flip flops CRC4–CRC15 carry residual information about such an error which would have been detected if additional error detection bits had been transmitted. Transmission of such additional bits would have lengthened the total data stream undesirably. The portion of the CRC register not checked at the end of the frame will affect the value at the end of subsequent frames, thus making it likely that a previously undetected error will be detected at the end of a subsequent frame.

As discussed above, in one embodiment, at the end of the data stream (or less frequently than once for each frame) a more stringent error test is made. The circuit for this more stringent test is most clearly shown in FIG. 5b.

Response to Failing Error Test

In one logic cell array embodiment, if the partial error check provided by either OR gate OR55 or by OR gate OR61 indicates errors, the error indication on line FAILCHECK stops the clock used for shifting data (not shown) and provides an error signal on an external pin of the logic cell array (not shown). A user may use this error signal to reset the entire logic cell array, or in some embodiments to reload the last few frames. In another embodiment, detection of an error can cause an immediate reset of the logic cell array without user intervention. Because an error indication may indicate an error which occurred before the last frame just checked, it is preferable not to assume the error occurred in the last frame checked.

Checking of Serial or Partial Input Data

Figure 8A:
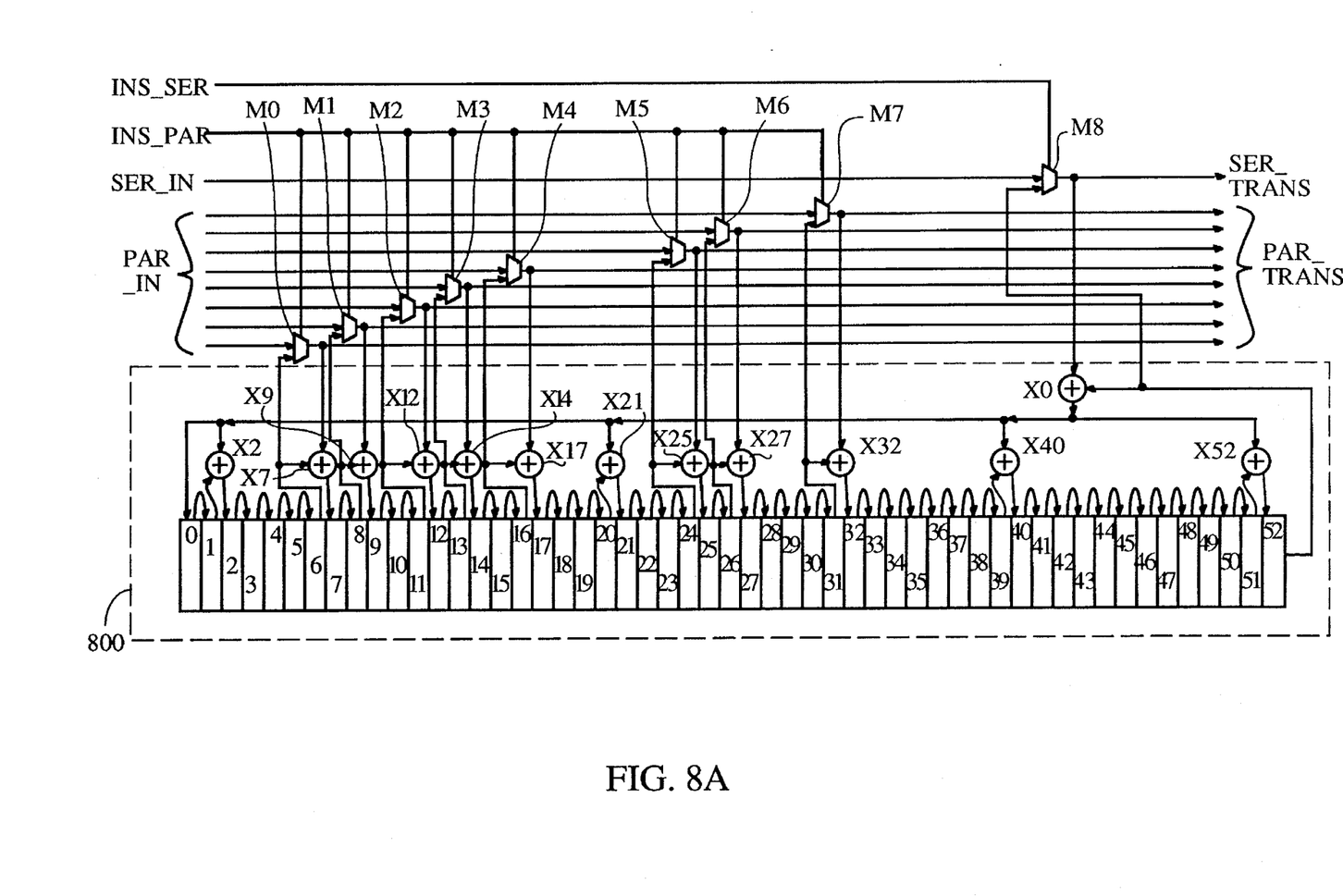
FIGS. 8A, 8B, and 8C show block diagrams of circuits according to other embodiments of the present invention which generate a signature for checking of parallel input signals.
Figure 8B:
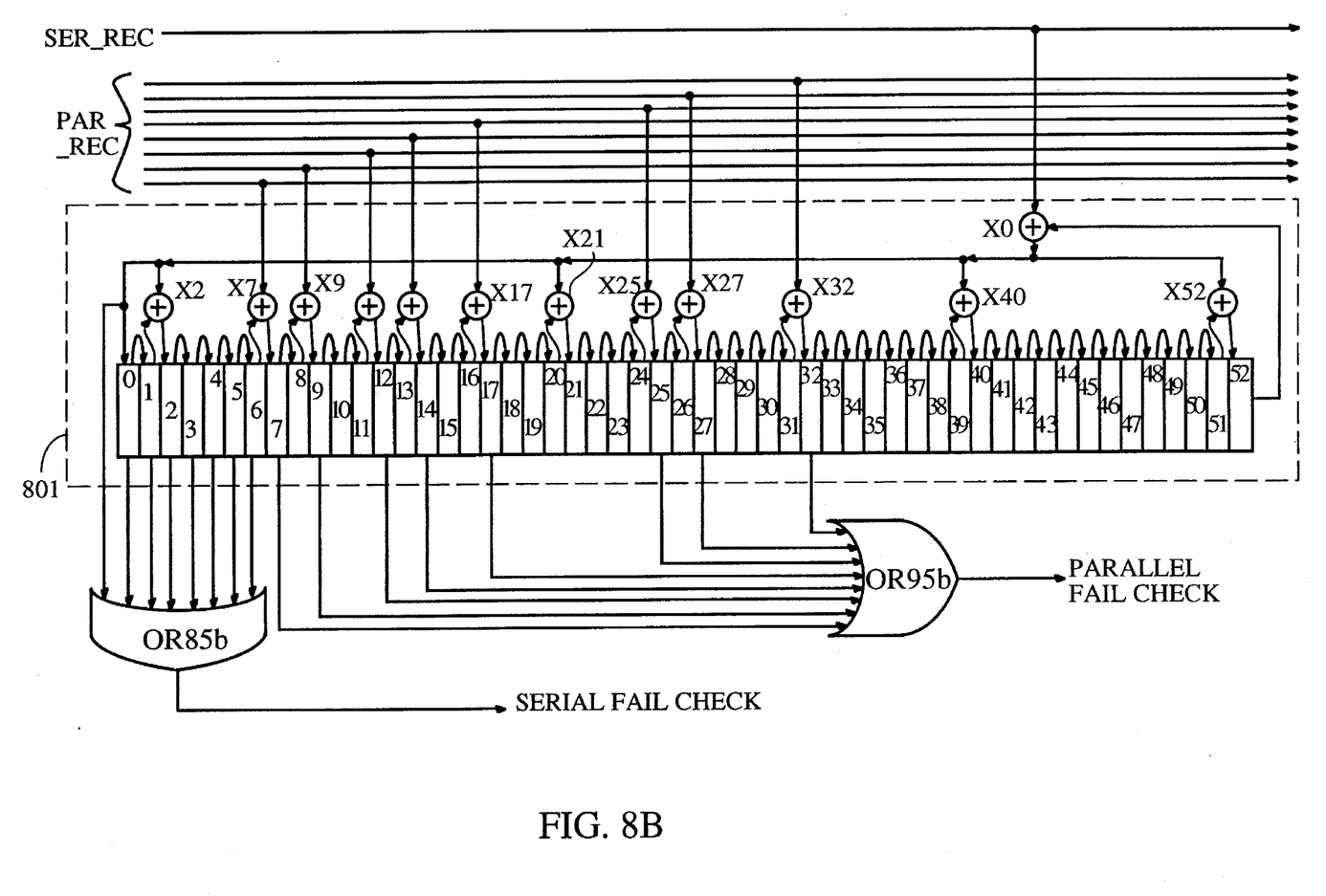
Figure 8C:
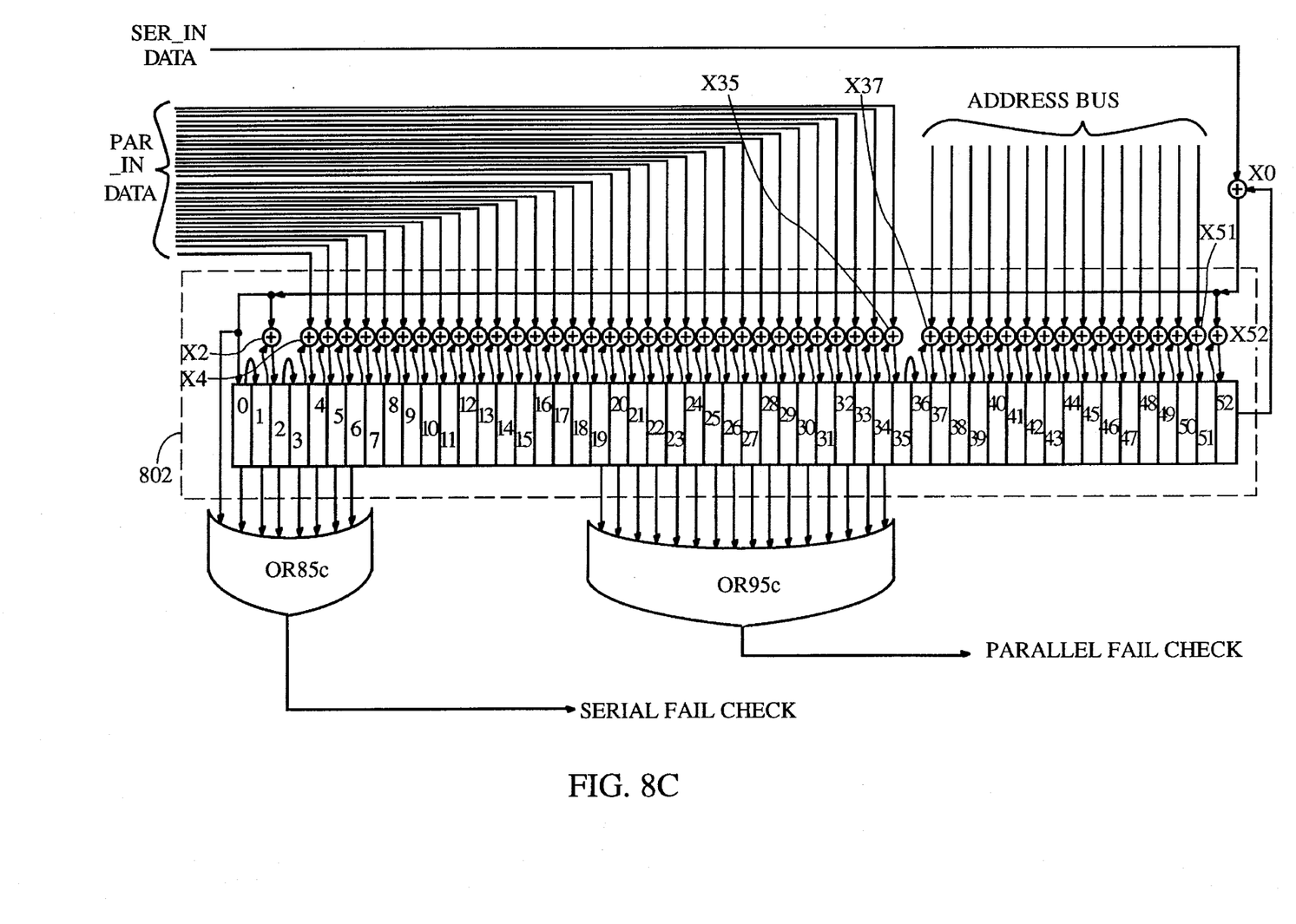

FIGS. 8A, 8B, and 8C show structures for signature analysis checking of parallel input signals in addition to checking of serial data.

FIG. 8A shows a signature register and related circuitry for generating a transmit signal at a transmit end. FIG. 8B shows the corresponding signature register and related circuitry for analyzing the signal at the receive end. FIG. 8C shows a receive end structure for checking errors in a device loaded by addressing data words rather than loading a serial or parallel bit stream.

FIG. 8A is a hardware embodiment for generating a transmit end error checkword or signature. An equivalent result can be achieved by software which processes the data in the same manner as the hardware and adds corresponding signature information to the original data stream. In FIG. 8A, signature register 800 is shown. A clock signal is provided to each cell of register 800, as in any shift register, but for simplicity is not shown. Signature register 800 operates similarly to shift register 70 of FIG. 7. At each clock cycle, data shift one cell to the right. Register 800 combines signal feedback similar to the CRC checking feature illustrated in FIG. 7 with the parallel data loading of eight data bits. Many variations on the structure of FIG. 8A are of course possible. In the particular example of FIG. 8A, signature register 800 includes 53 cells. Cells 0, 2, 21, 40, and 52 receive output signals from XOR gates X0, X2, X21, X40, and X52. XOR gates X2, X21, X40, and X52 receive as one of their input signals the output signal for XOR gate X0. XOR gate X0 receives as its input signals the output signal from cell 52 and the output signal from multiplexer M8, which in turn receives the input bit stream on one of its input terminals SER_IN.

Parallel Mode

In parallel mode, multiplexer M8 is set to forward the SER_IN signal, and a constant zero is placed onto line SER_IN so that XOR gate X0 forwards the output of cell 52 to XOR gates X2, X21, X40, and X52. Thus, in parallel mode, one input signal to these XOR gates is the output signal from cell 52 and the other input signal is from the previous cell. Each XOR gate drives its respective cell. For example, cell 2 receives the output of XOR gate X2, which receives the output signal from cell 52 and the output of cell 1.

In addition to these feedback signals, eight data input signals are provided to XOR gates X7, X9, X12, X14, X17, X25, X27, and X32, each of which receives an input from a previous cell and provides an output to a respective one of cells 7, 9, 12, 14, 17, 25, 27, and 32, as shown. A signature signal is repeatedly generated and updated by signature register 800 and is periodically added to the data stream. In parallel mode, after a specified number of clock cycles, line INS_PAR causes multiplexers M0–M7 to insert eight parallel data bits into the data stream. Thus the PAR_TRANS signals generated for parallel transmission by the circuit of FIG. 8A include both the PAR_IN signals input to the circuit and the signature bits present in cells 6, 8, 11, 13, 16, 24, 26, and 31 at the time the INS_PAR signal switches.

Serial Mode

In serial mode, all PAR_IN signals are held at zero, and the INS_PAR line is held at zero. Thus, XOR gates X7, X9, X12, X14, X17, X25, X27, and X32 receive logical zero signals from multiplexers M0–M7 respectively, and therefore forward the output of the previous cell to the next cell. The particular embodiment shown in FIG. 8A does not generate a CRC signature because the feedback bits are not positioned to follow a CRC formula. However, an embodiment which positioned bits to generate a CRC function would have the property of generating a CRC function in serial mode and generating a useful signature for parallel bit checking in parallel mode.

Receiving End

At the receiving end, a structure for checking failure shown in FIG. 8B includes both serial and parallel fail check circuits. The parallel fail check circuit comprises 8-input OR gate OR95b which receives output signals from cells 7, 9, 12, 14, 17, 25, 27, and 32 and generates a logical one PARALLEL FAIL CHECK output signal when these values are not all zero. The serial fail check circuit comprises 8-input OR gate OR85b which receives output signals from cells 0–6 and the output of XOR gate X0, and generates a logical one SERIAL FAIL CHECK signal when these values are not all zero. When the circuit is being used in a parallel data input mode, a logical 0 is applied to the SER_IN input terminal and data are applied to the eight PAR_IN input terminals. When the circuit is being used for serial input data, logical 0's are applied to the PAR_IN terminals and data are applied to the SER_IN terminal. Clocking to test the parallel or serial fail check signal occurs one cycle later than the clocking at the transmit end to insert the signature bits into the bit stream.

The rationale behind the structure is that on the cycle when the data from cells 6, 8, 11, 13, 16, 24, 26, and 31 inserted at the transmit end are combined by XOR gates X7, X9, X12, X14, X17, X25, X27, and X32 at the receive end with the data from cells 6, 8, 11, 13, 16, 24, 26, and 31 at the receive end, if the data stream has been properly transmitted, the outputs of XOR gates X7, X9, X12, X14, X17, X25, X27, and X32 will all be zero. These zero's are detected by OR gate OR95*b* at the next clock cycle. Alternatively, of course, the inputs to OR gate OR95*b* can be taken from the outputs of XOR gates X7, X9, X12, X14, X17, X25, X27, and X32 and tested one cycle earlier.

Of course other patterns of zero's and one's can likewise be generated at the transmit end and tested for at the receive end, for example by inverting selected input signals or by generating further functions, such as XOR, of selected combinations of input signals.

Rather that providing a circuit for checking the data at the receive end, another means of checking is for the programming device (microprocessor, etc) to simply read part of the contents of the signature register at points throughout the configuration, and perform the check itself. This may take several read cycles if the portion of the signature register read back by the processor is longer than the data bus is wide.

Signature Analysis for Randomly Addressable Loading

Another embodiment is useful for checking either serial or parallel input data on a data bus loaded by addressing memory locations on an address bus.

The embodiment of FIG. 8C is intended primarily for parallel input data which is loaded by addressing words of memory cells in the logic device. However, provision is also included for testing a serial data stream. FIG. 8C shows the circuit for testing at the receive end. In the embodiment of FIG. 8C, the address bus is 15 bits wide and the data bus is 32 bits wide. The embodiment of FIG. 8C uses a 53-bit signature register 802 and enters 32 data bits and 15 address bits into positions in signature register 802. A corresponding circuit or equivalent software would be provided at the transmit end, as discussed for the earlier figures.

Both the data and address signals are checked for accuracy by generating a signature at the transmit end, either in a checkword register or by software, and inserting a function of the signature periodically into the data stream as was described in connection with FIG. 8A. Then at the receive end, the resultant signature is are tested for the proper bit pattern. In the embodiment of FIG. 8C, both address and data input signals are checked for errors. The signature reflects both the incoming parallel data and some feedback bits, and thus retains a pattern related to all previously transmitted data.

In FIG. 8C, OR gate OR85*c* operates in the serial mode and tests for a pattern of all zero's at the output terminals of cells 0–6 and XOR gate X0. In the parallel mode, OR gate OR95*c* tests for an expected pattern in the checkword register or signature.

In a hardware embodiment, the signature is generated continuously (every clock cycle) at the transmit end. If a function of the signature is inserted frequently into the transmitted data stream, the probability of detecting an error will be extremely high. Even if the function is inserted less frequently, the probability of detecting an error will be high because of the continuous feedback into the signature register, so that previous error information is not lost.

A novel and useful aspect of the embodiment of FIG. 8C is that a particular address, for example address zero, can be used for indicating error checking information is present at the receive end. In such an embodiment, in a structure which cooperates with that of FIG. 8C, this address triggers the testing of the checkword register at the receive end (for example, an OR gate which receives the address and in response to address zero enables a flip flop to receive the PARALLEL FAIL CHECK signal). Therefore, no fixed interval need be used for inserting error checking information into the data stream. If part of the data stream is critically important, error checking information may be inserted more frequently during transmission of this part of the data stream and less frequently for other parts. Similarly, for applications in which accuracy is more critically important, the data stream may be lengthened to a greater extent to insert frequent error checking information. Then for other applications in which speed and efficiency are more important, error checking information may be inserted less frequently. Since error checking information is designated by an address rather than by an interval, no change in hardware is needed to change the frequency of error checking.

In another embodiment, no specific address is used in a structure which cooperates with that of FIG. 8C to indicate that error checking information is present. Rather, the error checking information is sent and tested at regular intervals. In this embodiment, the write function is inhibited at the receive end at times when the error checking information is being sent so that no erroneous data will be written as the error checking information is being tested.

Further Embodiments

In light of the above description, other embodiments of the present invention will become obvious to those skilled in the art. The invention applies to telecommunication, modem transmission, reading from and writing to disk drives or tape drives and other applications in which data are to be transmitted. These and other embodiments are intended to fall within the scope of the present invention.

We claim:

1. Structure for detecting an error in a parallel set of bit streams, comprising:

means for receiving said parallel set of bit streams;

means for generating an error checkword from said parallel set of bit streams, at least one bit of said error checkword being a function of all previously transmitted bits in said parallel set of bit streams;

means for testing a function of said error checkword including said at least one bit; and means for counting bits in said parallel set of bit streams wherein at a given count said means for counting bits activates said means for testing a function;

in which said means for generating an error checkword comprises a computer controlled by a software algorithm.

2. Structure for detecting an error in a parallel set of bit streams, comprising:

means for receiving said parallel set of bit streams;

means for generating an error checkword from said parallel set of bit streams, at least one bit of said error checkword being a function of all previously transmitted bits in said parallel set of bit streams;

means for testing a function of said error checkword including said at least one bit; and means for counting bits in said parallel set of bit streams wherein at a given count said means for counting bits activates said means for testing a function;

in which said means for generating an error checkword comprises a hardware circuit.

* * * * *